(12) United States Patent
Mc Ardle et al.

(10) Patent No.: US 6,273,554 B1
(45) Date of Patent: Aug. 14, 2001

(54) APPARATUS FOR ALIGNING A FLEXIBLE CIRCUIT ON A INK JET PRINTER CARRIAGE

(75) Inventors: Karen M. Mc Ardle, Dublin (IE); Marcus Scholz; Steven R Card, both of San Diego, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/557,447

(22) Filed: Apr. 25, 2000

(51) Int. Cl.[7] .................................................. B41J 2/14
(52) U.S. Cl. ...................................................... 347/49
(58) Field of Search ............................... 347/49, 50, 37, 347/39

(56) References Cited

U.S. PATENT DOCUMENTS

| | | | |
|---|---|---|---|
| 4,706,097 | 11/1987 | Harmon | 346/139 C |
| 4,755,836 | 7/1988 | Ta et al. | 347/49 |
| 4,872,026 | 10/1989 | Rasmussen et al. | 347/56 |
| 4,907,018 | 3/1990 | Pinkerpell et al. | 346/139 R |
| 5,392,063 | 2/1995 | Rhoads | 347/49 |
| 5,734,394 | * | 3/1998 | Hackleman | 347/42 |
| 5,917,518 | * | 6/1999 | Ohashi et al. | 347/37 |

* cited by examiner

*Primary Examiner*—N. Le
*Assistant Examiner*—Michael Nghiem

(57) ABSTRACT

Apparatus for aligning a flexible circuit on an ink jet printer carriage includes three members located on a wall of the print carriage. The members are positioned to receive a flexible circuit having a circular hole and two elongate slots therein. Each slot has a major axis that intersects the center of the circular hole. The members permit the flexible circuit to flatten out during assembly of the carriage and to remove any unevenness in its surface.

5 Claims, 5 Drawing Sheets

APPARATUS FOR ALIGNING A FLEXIBLE CIRCUIT ON A INK JET PRINTER CARRIAGE

RELATED APPLICATION

This application is related to the following copending utility patent application, each filed concurrently on Apr. 25, 2000: Ser. No.: 09/558,308 by Scholz et al., entitled "A Spring for Latching a Print Cartridge in a Carriage."

FIELD OF INVENTION

The present invention generally relates to ink jet printers and, more particularly, to carriages that mount, align, and scan ink jet print cartridges in those printers.

BACKGROUND OF THE INVENTION

The general design and construction of carriages that retain and align print cartridges in printers and scan these print cartridges through print zones is well known. Examples of the patents that have issued in the field of ink jet printing technology include:

U.S. Pat. No. 4,755,836 entitled "Printhead Cartridge and Carriage Assembly" by Ta et al. issued Jul. 5, 1988;

U.S. Pat. No. 4,872,026 entitled "Ink-jet Printer with Printhead Carriage Alignment Mechanism" by Rasmussen et al. issued Oct. 3, 1989;

U.S. Pat. No. 4,907,018 entitled "Printhead-Carriage Alignment and Electrical Interconnect Lock-in Mechanism" by Pinkerpell issued Mar. 6, 1990; and U.S. Pat. No. 5,392,063 entitled "Spring Cartridge Clamp for Inkjet Printer Carriage" by Rhoads issued Feb. 21, 1995.

The electronics in a printer that fire an ink jet print cartridge on command are connected to the electrical contact pads on a print cartridge by a flexible circuit. Such a flexible circuit is described in U.S. Pat. No. 4,706,097 entitled "Near-linear Spring Connect Structure for Flexible Interconnect Circuits" by Harmon. Good electrical contact and precise mechanical alignment are required at the interface between the raised bumps on the flexible circuit and contact pads on the print cartridge.

One problem that has developed with such flexible circuits is that during assembly of the carriage, the flexible circuits can buckle slightly. In other words, the flexible circuit can develop high and low areas and the required electrical contact and mechanical alignment may not be achieved.

It will be apparent from the foregoing, there is a need for an approach that allows the flexible circuit to flatten itself out during assembly of the carriage and to remove any unevenness in its surface.

SUMMARY OF THE INVENTION

Briefly and in general terms, an apparatus according to the invention includes a flexible circuit having a circular hole and two elongate slots. Each slot has a major axis that intersects the center of the circular hole. The carriage has three members that receive the circular hole and the two slots and permit the flexible circuit to align itself when placed over the members.

Other aspects and advantages of the invention will become apparent from the following detailed description, taken in conjunction with the accompanying drawings, illustrating by way of example the principles of the invention.

DESCRIPTION OF THE PREFERRED EMBODIMENT

Figure 1:
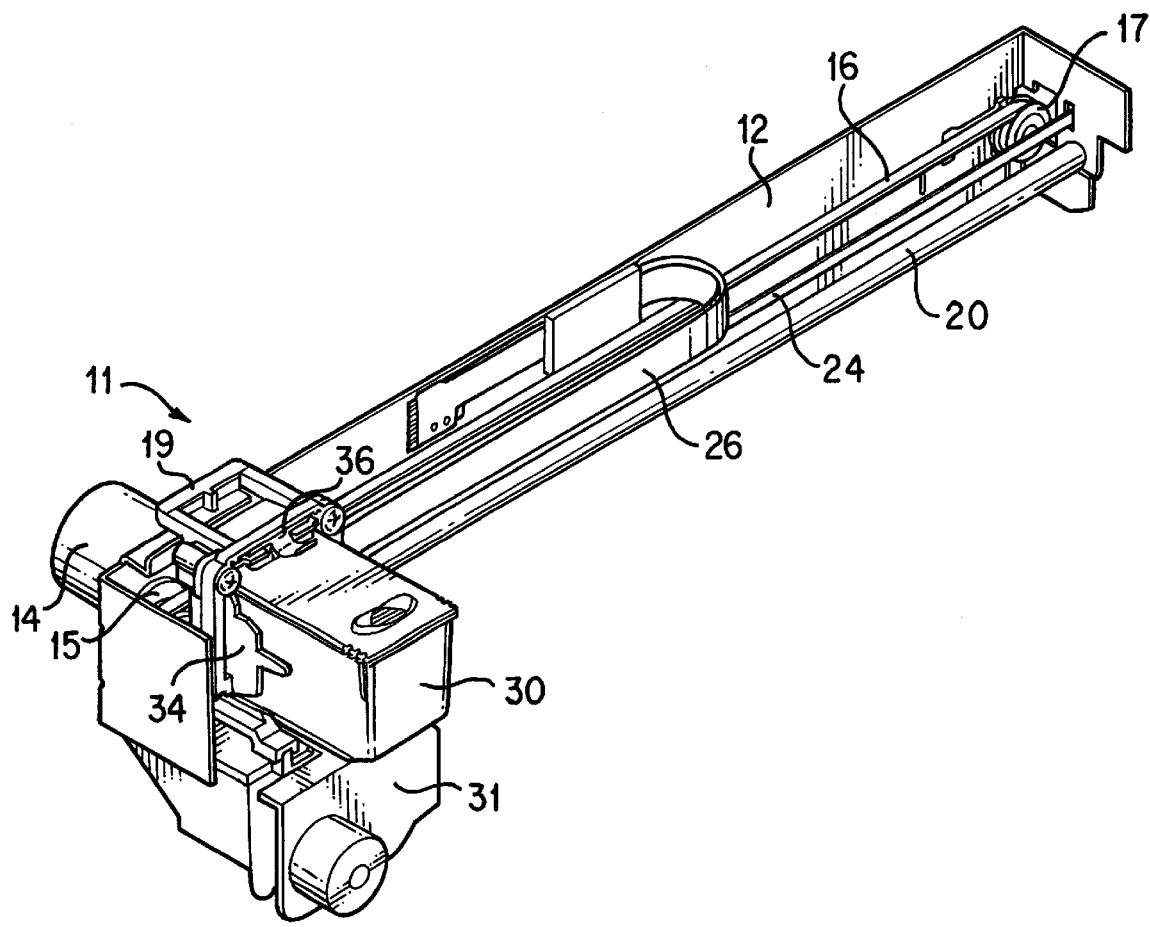
FIG. 1 is a perspective view of an ink jet printer mechanism for a facsimile machine embodying the principles of the invention.

As shown in the drawings for the purposes of illustration, the invention is embodied in three members located on a wall of a print carriage. The members are positioned to receive a flexible circuit having a circular hole and two elongate slots therein. Each slot has a major axis that intersects the center of the circular hole. The members permit the flexible circuit to flatten out during assembly of the carriage and to remove any unevenness in its surface.

The apparatus offers a simple solution and achieves the required electrical contact and mechanical alignment between the raised bumps on the flexible circuit and the electrical contact pads on the print cartridge.

Figure 2:
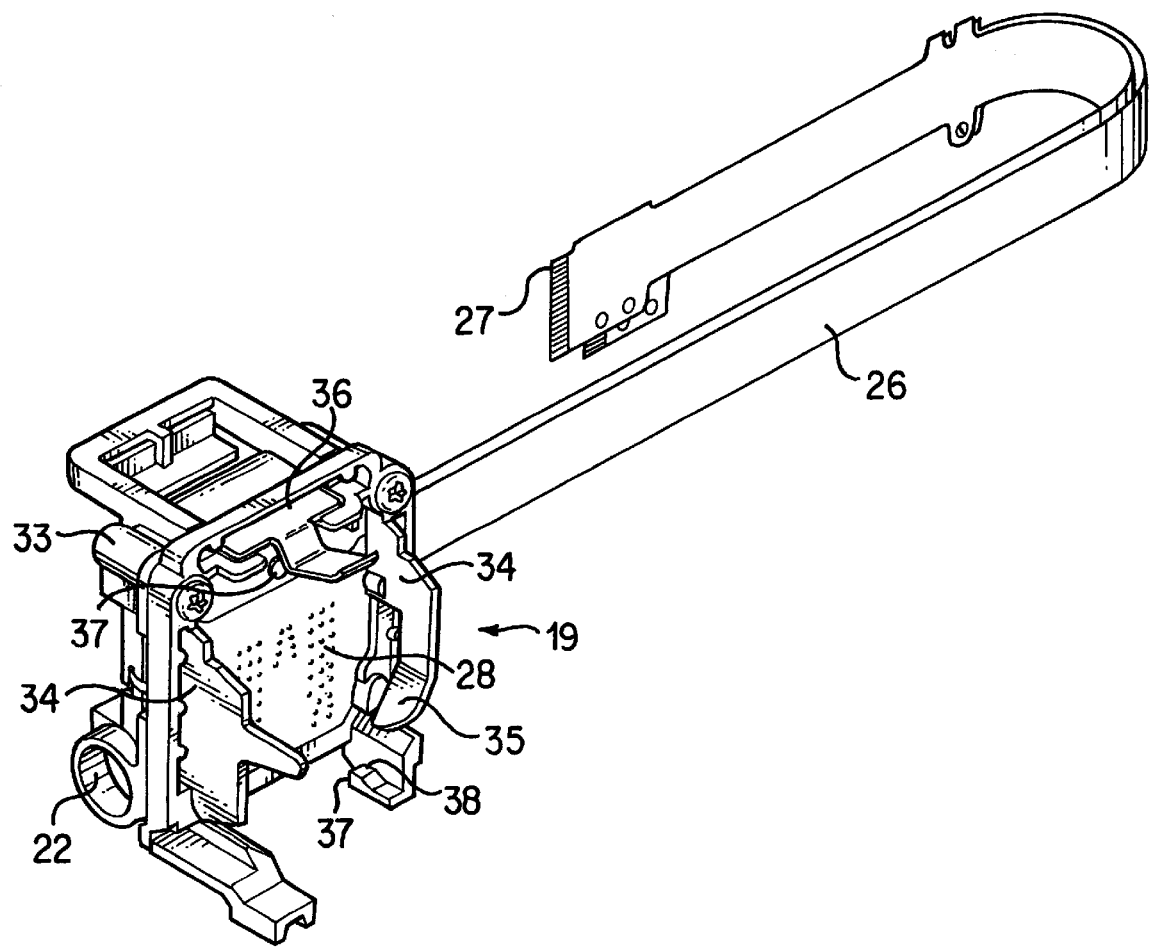
FIG. 2 is a perspective view of the carriage in the printer mechanism of FIG. 1.
Figure 3:
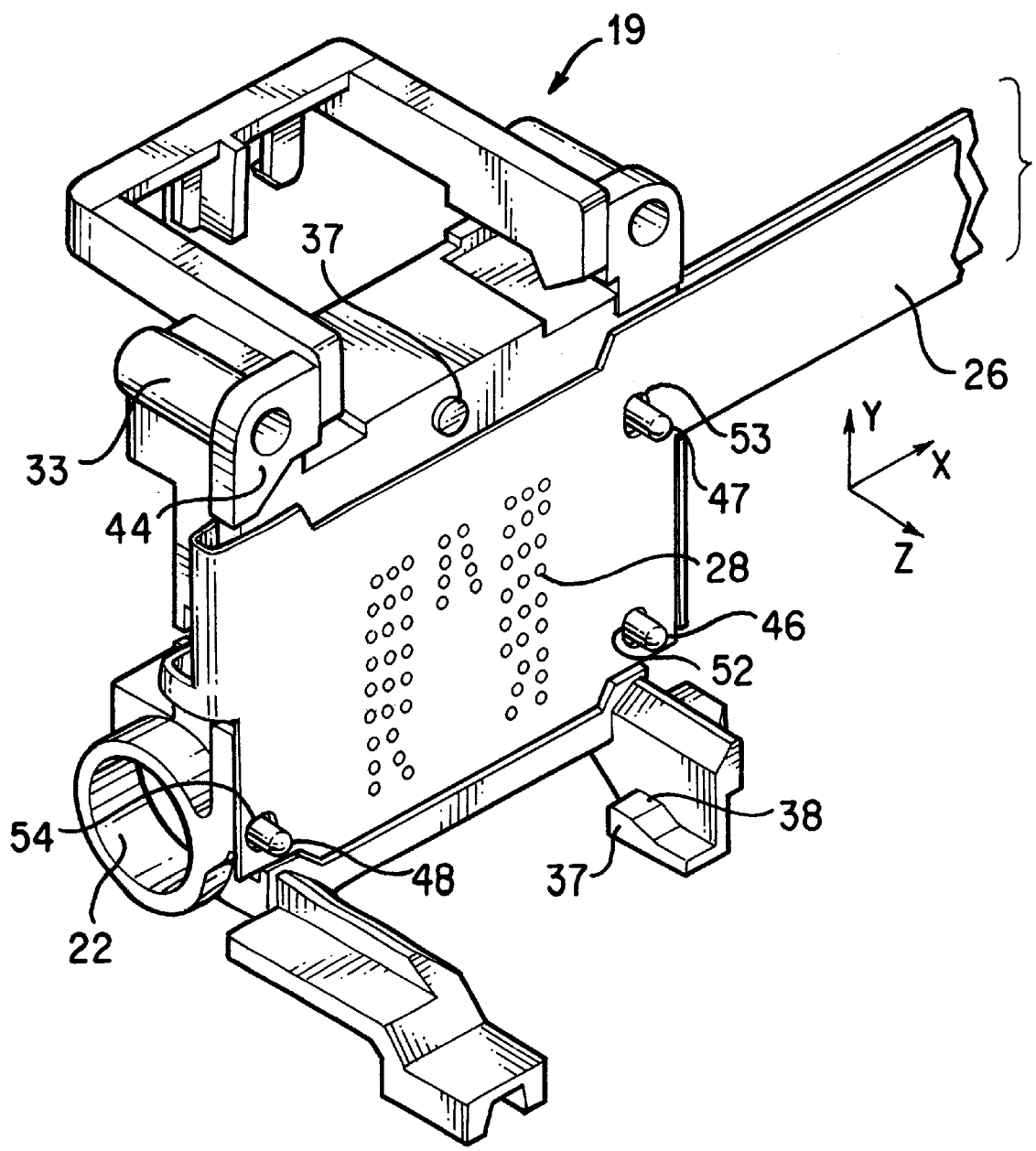
FIG. 3 is a perspective view, partially cut away, of the carriage base in the printer mechanism of FIG. 1.

Referring to FIG. 1, reference numeral 11 generally indicates a printer mechanism for a facsimile machine. The printer mechanism 11 includes a chassis 12 which provides the structural back bone of the apparatus because most of the components of the mechanism are mounted on it. Reference numeral 14 indicates a DC drive motor that is connected to a drive reduction gear train 15. The drive train 15 is, in turn, connected to a tooth gear belt 16 which is tensioned by a follower 17. The tooth gear belt 16 is physically attached to a carriage 19. The DC motor 14, drive train 15, and tooth gear belt 16 move the carriage 19 back and forth along a slider rod 20 which is parallel to the scan axis of the facsimile machine. The slider rod 20 is stationary with respect to the chassis 12. Referring to FIGS. 2 and 3, the carriage 19 is supported on the slider rod 20, FIG. 1, and is constrained for 2-axis movement along the rod by two bushings 22.

Referring to FIG. 1, as the carriage 19 is driven back and forth along the slider rod 20, the position of the carriage is sensed by a conventional encoder reader module (not shown) mounted on the rear of the carriage. The encoder reader module reads a stationary encoder strip 24 mounted on the chassis 12. The signals from the encoder reader module are sent to a circuit likewise not shown.

In FIG. 1 reference numeral 30 indicates an ink jet print cartridge that is received, retained, and aligned in the carriage 19. The print cartridge 30 is maintained by a service station 31 that wipes the print cartridge during operation and caps the print cartridge during non-operation.

In FIGS. 1–4, inclusive, reference numeral 26 indicates a flexible circuit or interconnect which is a plurality of electrical circuits connecting the print cartridge 30, FIG. 1, with the printer electronics (not shown). During printing, electrical signals from the printer electronics travel through the flexible circuit 26 and fire the print cartridge 30 on command. The flexible circuit 26 has a terminated end 27 that plugs into a connector leading to the printer electronics. The flexible circuit 26 also leads to a pattern of raised bumps 28.

Figure 5:
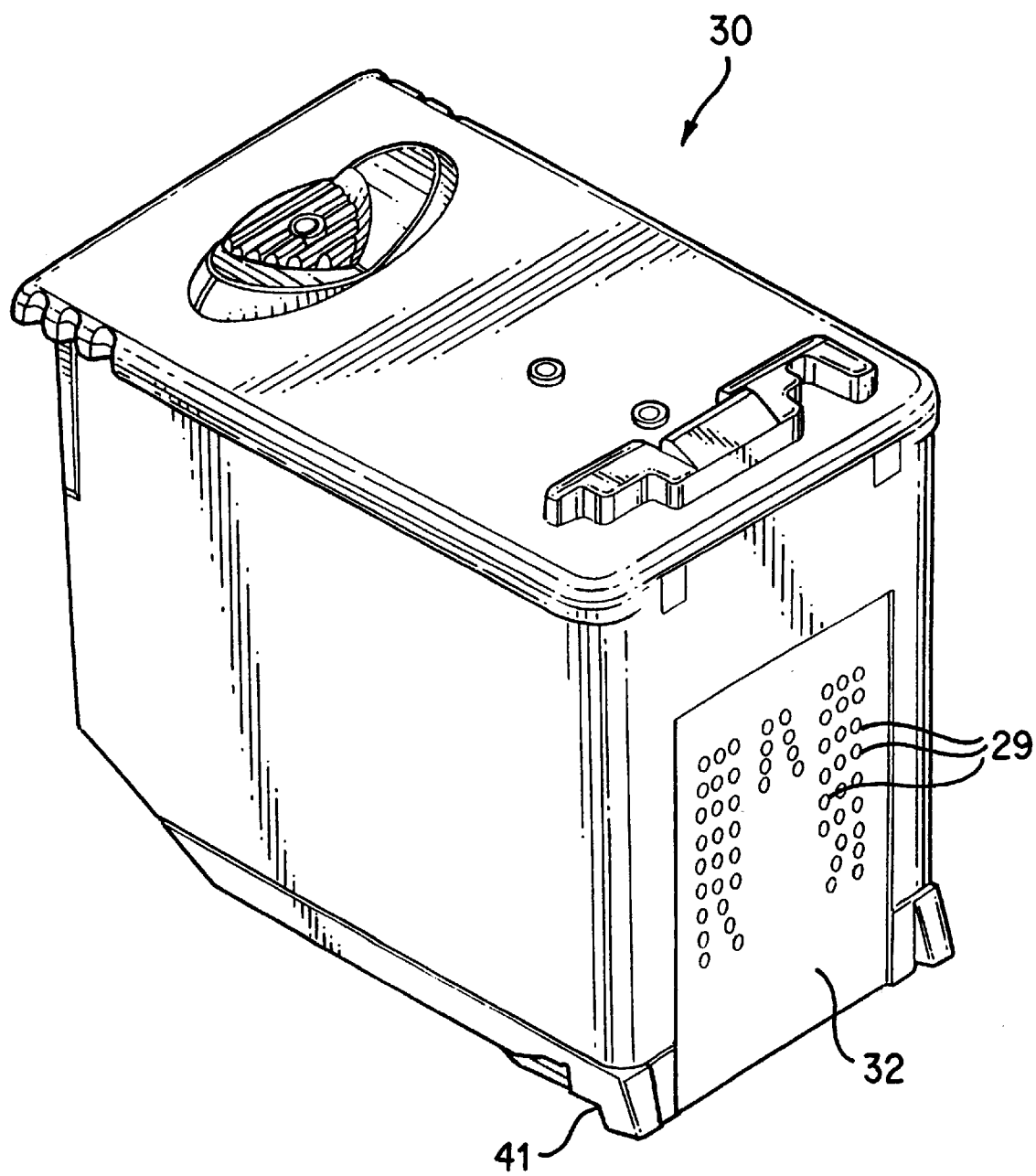
FIG. 5 is a perspective view of the print cartridge from the printer mechanism of FIG. 1.

The pattern of the bumps mirrors the layout of the electrical contact pads 29 on the TAB circuit 32 on the print cartridge 30, FIG. 5. Behind the pattern of bumps 28 is a spring pad fabricated from an elastomer material. The spring pad has a plurality of posts on it that correspond to the locations of the bumps. The spring pad provides a reaction force behind the flexible circuit 26. As the print cartridge 30 is pushed against the flexible circuit 26 during loading, the spring pad pushes back, producing a force at the interface between the print cartridge 30 and the flexible circuit 26 and thereby insuring satisfactory electrical connections across the interface. The bumps 28, the spring pad, and the posts are further described in U.S. Pat. No. 4,706,097 by Harmon entitled "Near-linear Spring Connect Structure for Flexible Interconnect Circuits" dated Nov. 10, 1987.

Referring to FIG. 2, the carriage 19 includes a carriage base 33 that houses the bushings 22, attaches to the tooth gear belt 16, FIG. 1, and anchors a latch spring 36. Rigidly connected to the carriage base 33 is a chute 34, FIG. 2, that receives and retains the print cartridge 30, FIG. 1. Located in one wall of the chute 34 is a side bias spring 35 that urges the print cartridge against the opposite wall of the chute and a tertiary carriage datum 40, FIG. 4. The carriage further includes three primary carriage datums 37 and two secondary carriage datums 38. These datums 37, 38, and 40 are latched by complementary surfaces, the print cartridge datums 41, FIG. 5, on the print cartridge 30 and align the print cartridge with respect to the carriage 19 in all directions. In other words, the carriage datums define the X, Y, and Z planes that the print cartridge 30 seats against.

Figure 4:
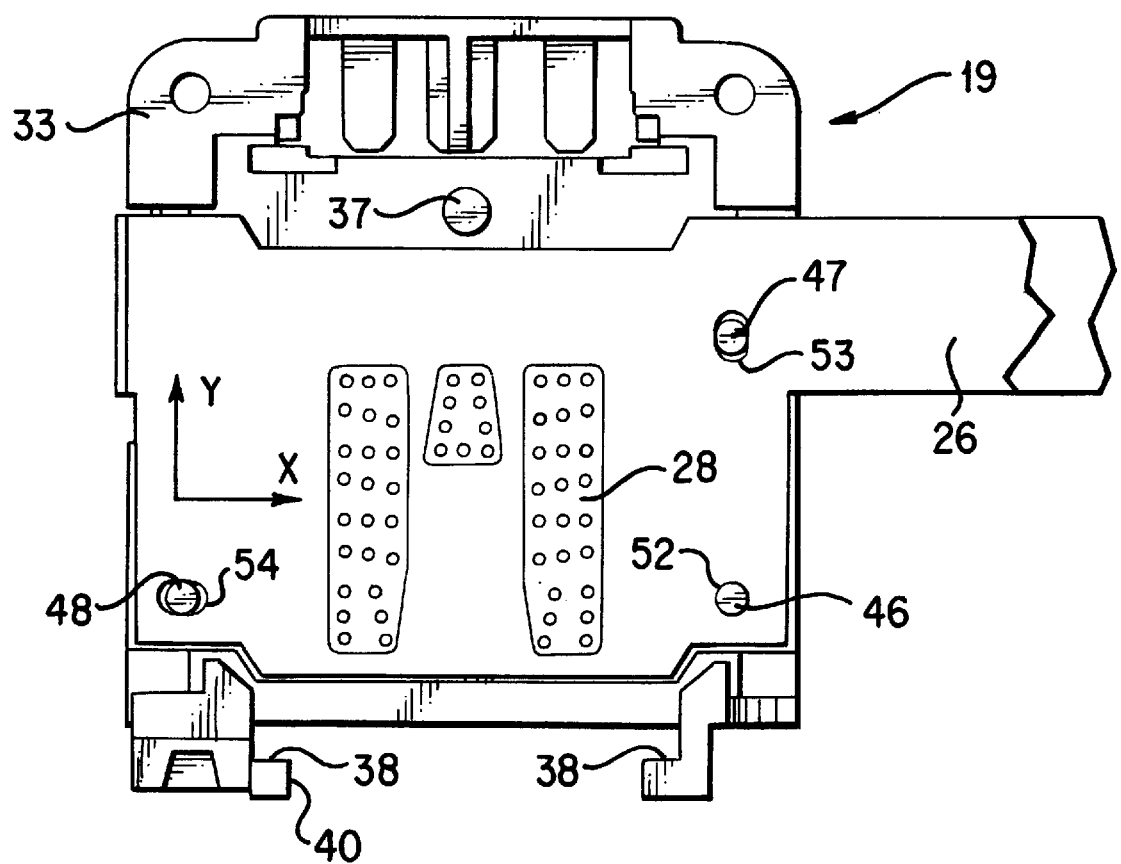
FIG. 4 is a front elevation view, partially cut away, of the carriage base in the printer mechanism of FIG. 1

FIGS. 3 and 4 illustrate the carriage base 33 with the chute 34, FIG. 2, removed.

Referring to FIG. 3, the X-axis is the scan axis or the longitudinal axis of the slider rod 20, FIG. 1 or the axis defined by the centers of the bushings 22. The +Y-axis is vertically upward. The +Z-axis is normal to the front face of the carriage base 33.

In FIG. 3 reference numeral 44 indicates the front face of the carriage base 33. This face is planar and defines the +Z-axis. After assembly of the carriage, the flexible circuit 26 lies flat against this face. Positioned on the front face 44 are three cylindrical members 46, 47, and 48 or pins. These members are normal to the front face of the carriage base and their terminal ends are slightly tapered. Each member is located on a vertex of a triangle. In particular, in FIG. 4 the triangle is a right triangle with member 46 being located at the 90° vertex. The triangle is irregular in that it is not an isosceles triangle with two sides of equal length. On these three members 46, 47, 48, the flexible circuit 26 is mounted and aligned.

Referring to FIG. 4, the flexible circuit 26 has a circular hole 52, a vertical slot 53, and a horizontal slot 54. The circular hole is located at the lower right hand corner of the front face 44 of the carriage base 33 and is received on the member 46. The diameter of the circular hole corresponds to the outside diameter of the member 46. The vertical slot 53 is located vertically above the circular hole 52 along the +Y-axis and has a major axis that intersects the center of the circular hole 52. The major axis is the slot's longitudinal axis or the slot's longer dimension. The minor axis of the slot or the slot's shorter dimension has a length that corresponds with the diameter of the member 53. The horizontal slot 54 is located horizontally to the left of the circular hole 52 along the -X-axis and has a major axis that intersects the center of the circular hole 52. The minor axis of the slot 54 or the slot's shorter dimension has a length that corresponds with the diameter of the member 48.

Referring to FIG. 3, the flexible circuit 26 is a continuous, unitary part that circles around the back of the carriage base 33 and across the front face 44. The circular hole 52 is received on member 46, the vertical slot 53 on member 47, and the horizontal slot 54 on member 48.

During assembly the flexible circuit 26 is passed around the carriage base 33 and positioned on the members 46, 47, 48. The circular hole 52 locates the pattern of raised bumps 28 with one degree of freedom. In other words, the circular hole 52 limits any translation of the flexible circuit 26 with respect to the plane of the front face 44 of the carriage base 33. The circular hole, however, does not constrain rotation of the flexible circuit about the Z-axis. The vertical and horizontal slots 53, 54 constrain rotation of the flexible circuit about the Z-axis but permit the flexible circuit to expand or contract along their respective major axes. Such expansion and/or contraction allows the flexible circuit to flatten out and to remove any unevenness in its surface that may have developed during manufacture of the flexible circuit or assembly of the carriage. This motion removes any buckling that may have occurred and achieves good electrical contact and precise mechanical alignment at the interface between the raised bumps 28 on the flexible circuit 26 and the electrical contact pads 29 on the print cartridge 30.

It should be appreciated that although the flexible circuit 26 and its aligning apparatus have been described in connection with a printer mechanism for a facsimile machine, they can be used in any ink jet printer mechanism of any size or configuration.

Further, the aligning apparatus has been described with three pins or members each located at the vertex of a right triangle. Other types of triangles are contemplated to be within the scope of this invention including isosceles triangles and irregular triangles.

Although specific embodiments of the invention have been described and illustrated, the invention is not to be limited to the specific forms or arrangement of parts so described and illustrated. The invention is limited only by the claims.

We claim:

1. Apparatus for aligning a flexible circuit on an ink jet printer carriage, comprising:
   a) a flexible circuit having a circular hole and two elongate slots therein, said circular hole having a center and each slot having a major axis that intersects the center of the circular hole;
   b) a wall on a print carriage for mounting the flexible circuit; and
   c) three members located on the wall and positioned to receive the circular hole and the two slots in the flexible circuit, said members align the flexible circuit on the carriage when placed thereon.

2. The apparatus of claim 1 wherein the wall has a plane and the member receiving the circular hole limits translation of the flexible circuit with respect to said plane and the two members receiving the slots limit rotation of the flexible circuit about the member receiving the hole.

3. The apparatus of claim 1 wherein each member is located at a vertex of a triangle.

4. The apparatus of claim 3 wherein the triangle is a right triangle having a 90° vertex and the member receiving the circular hole is located at the 90° vertex.

5. The apparatus of claim 1 wherein the two members receiving the slots allow the flexible circuit to flatten out and to remove any unevenness in its surface.

* * * * *